(12) United States Patent
Dang et al.

(10) Patent No.: US 8,127,255 B2
(45) Date of Patent: *Feb. 28, 2012

(54) METHOD TO EXTRACT AND APPLY CIRCUIT FEATURES IN ORGANIC SUBSTRATE FOR AUTOMATION OF WARP MODELING

(75) Inventors: Hien Phu Dang, Nanuet, NY (US); Vijayeshwar Das Khanna, Millwood, NY (US); Arun Sharma, New Rochelle, NY (US); Sri M. Sri-Jayantha, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 619 days.

This patent is subject to a terminal disclaimer.

(21) Appl. No.: 12/260,957

(22) Filed: Oct. 29, 2008

(65) Prior Publication Data

US 2009/0313588 A1 Dec. 17, 2009

Related U.S. Application Data

(63) Continuation-in-part of application No. 12/136,886, filed on Jun. 11, 2008, now abandoned, and a continuation-in-part of application No. 12/136,876, filed on Jun. 11, 2008, now abandoned.

(51) Int. Cl.
*G06F 17/50* (2006.01)
(52) U.S. Cl. .......... 716/50; 716/51; 716/52; 716/55
(58) Field of Classification Search .......... 716/30, 716/51, 52, 55, 50; 382/144–145
See application file for complete search history.

(56) References Cited

U.S. PATENT DOCUMENTS

2009/0310848 A1* 12/2009 Dang et al. .......... 382/145
2009/0312960 A1* 12/2009 Dang et al. .......... 702/42

* cited by examiner

*Primary Examiner* — Jack Chiang
*Assistant Examiner* — Magid Dimyan
(74) *Attorney, Agent, or Firm* — Daniel P. Morris; Ryan, Mason & Lewis, LLP

(57) ABSTRACT

A method of characterizing an organic substrate including a plurality of circuit layers is provided includes the steps of: receiving an image of the organic substrate, the image including a geometric description of the circuit layers of the substrate; segmenting the substrate into multiple processing regions based, at least in part, on geometric coordinates of circuit structures defined in the image of the substrate; generating a circuit layer image corresponding to a selected one of the processing regions of the substrate; identifying one or more geometric features in the circuit layer image; estimating at least one thermomechanical property of the circuit layer image as a function of the identified geometric features; repeating the steps of receiving an image, generating a circuit layer image, identifying one or more geometric features in the circuit layer image, and estimating at least one thermomechanical property of the circuit layer image until all circuit layers in the substrate have been processed; and generating a 3-D representation of the selected one of the processing regions of the substrate including the plurality of circuit layer images as a function of the at least one thermomechanical property of each of the plurality of circuit layer images.

18 Claims, 18 Drawing Sheets

800

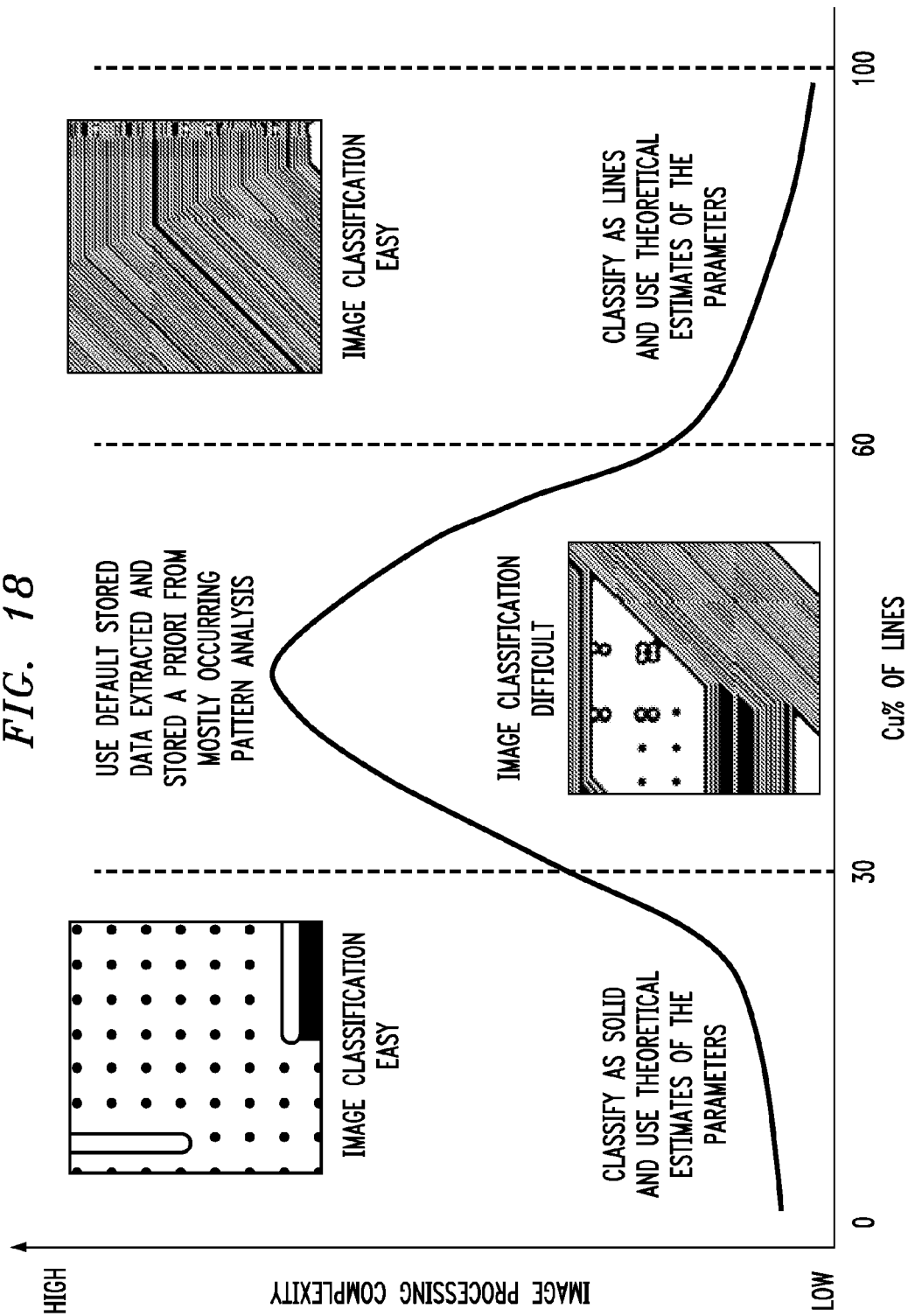

METHOD TO EXTRACT AND APPLY CIRCUIT FEATURES IN ORGANIC SUBSTRATE FOR AUTOMATION OF WARP MODELING

CROSS-REFERENCE TO RELATED APPLICATION(S)

This application is a continuation-in-part of U.S. application Ser. No. 12/136,886 filed on Jun. 11, 2008 now abandoned and U.S. application Ser. No. 12/136,876 filed on Jun. 11, 2008, now abandoned the disclosures of which are incorporated herein by reference in their entireties.

FIELD OF THE INVENTION

The present invention relates generally to electrical and electronic devices, and more particularly relates to organic substrate modeling.

BACKGROUND OF THE INVENTION

A silicon die with high density inputs/outputs (I/O) typically requires an organic substrate to facilitate integration on a system board. A substrate usually consists of a core at the center and multiple layers of metal interconnect on both sides of the core. A dielectric insulating layer is usually placed between adjacent metal layers to electrically isolate the metal layers from one another. A substrate facilitates formation of an electrical link to the system board. It protects the die and modularizes the product development effort while simplifying the subsequent integration steps involved in the manufacturing of a larger computer or a consumer electronic product. The present trend in substrate technology is to transition from ceramic-based chip carriers (substrates) to organic material-based chip carriers. An organic polymer-based electronic chip carrier (substrate) is a cost-effective means to fan out I/Os and power connections from a high density silicon integrated circuit chip (semiconductor die).

The core of organic chip carriers (substrates) is typically about 400-800 $\mu$m thick and made of a fiber-reinforced organic or resin insulator material. In order to reduce cost, the core is eliminated in some substrates (e.g., coreless substrates). The metal interconnects are progressively built layer-by-layer on top and bottom surfaces of the core by a series of process steps. Most metal layers are patterned, while some metal layers are solid (e.g., metal ground or power planes). The steps involve electroless-plating, electroplating, etching, polishing, placement of dielectric resin, high temperature pressing of resin to form a laminate. Each circuit layer or a power or ground plane is separated by a sheet of photosensitive resin. Laser drilling of the resin followed by an electroplating process are used to fabricate vias (sometimes referred to as plated through holes PTH) that help connect the various metal layers. Multi-stack vias are used to link layers that are further apart within the build layers of a substrate.

The buildup layers between the die and the core are often referred to as "FC" (front circuit) layers, and the layers on the opposite side of the core are often referred to as "BC" (bottom circuit) layers. Since each metal layer is typically designed to optimize electrical performance, the mechanical characteristics of each layer are not precisely controlled. The FC layers generally have dense interconnect structure made of a pattern of metal lines, typically etched from a layer of copper deposited by means of a plating process. The BC layers, on the other hand, tend to be formed as a continuous sheet of copper with distributed holes for vias to pass through. Such a configuration inevitably leads to a substrate with asymmetric thermomechanical properties when viewed with respect to the center plane of the core.

A substrate design with asymmetric thermomechanical parameters can exhibit significant warp when it is constructed at high temperature and then cooled down to room temperature. Electronic manufacturing and assembly operations incorporating a substrate generally require a minimum acceptable warp. For example, for a substrate with 55×55 millimeter (mm) dimension in x-y, a warp up to 100 micrometers ($\mu$m) is usually considered acceptable. As the number of buildup layers and core thicknesses are changed, the warp levels can change according to their interaction with one another. The yield of substrates can be undesirably impacted if parametric symmetry is not maintained within corresponding limits.

SUMMARY OF THE INVENTION

Illustrative embodiments of the present invention provide techniques for accurate warp projection (estimation) of an organic chip carrier (i.e., substrate). Based on the enhanced warp projection model of the organic substrate, a design of the substrate can be optimized, in accordance with aspects of the invention, by iteratively modifying at least one parameter of the substrate as a function of a three-dimensional (3-D) representation of at least a portion of the substrate.

In accordance with one aspect of the invention, a method of characterizing an organic substrate including a plurality of circuit layers is provided. The method includes the steps of: receiving an image of the organic substrate, the image including a geometric description of the plurality of circuit layers of the substrate; segmenting the organic substrate into a plurality of processing regions based, at least in part, on geometric coordinates of circuit structures defined in the image of the substrate; generating a circuit layer image corresponding to a selected one of the processing regions of the substrate; identifying one or more geometric features in the circuit layer image; estimating at least one thermomechanical property of the circuit layer image as a function of the one or more identified geometric features; repeating the steps of receiving an image, generating a circuit layer image, identifying one or more geometric features in the circuit layer image, and estimating at least one thermomechanical property of the circuit layer image until all circuit layers in the substrate have been processed; and generating a 3-D representation of the selected one of the processing regions of the substrate including the plurality of circuit layer images as a function of the at least one thermomechanical property of each of the plurality of circuit layer images.

In accordance with another aspect of the invention, an apparatus for characterizing an organic substrate including a plurality of circuit layers includes a memory and at least one processor coupled to the memory. The processor is operative: to receive an image of the organic substrate, the image including a geometric description of the plurality of circuit layers of the substrate; to segment the organic substrate into a plurality of processing regions based, at least in part, on geometric coordinates of circuit structures defined in the image of the substrate; to generate a circuit layer image corresponding to a selected one of the processing regions of the substrate; to identify one or more geometric features in the circuit layer image; to estimate at least one thermomechanical property of the circuit layer image as a function of the one or more identified geometric features; to repeat steps of receiving an image, generating a circuit layer image, identifying one or more geometric features, and estimating at least one thermomechanical property of the circuit layer image until all circuit layers in the substrate have been processed; and to generate a 3-D representation of the selected one of the processing regions of the substrate including the plurality of circuit layer images as a function of the at least one thermomechanical property of each of the plurality of circuit layer images.

These and other features, objects and advantages of the present invention will become apparent from the following detailed description of illustrative embodiments thereof, which is to be read in connection with the accompanying drawings.

BRIEF DESCRIPTION OF THE DRAWINGS

FIG. 18 is a graphical representation of image classification based on the percentage of copper lines and the image processing complexity, in accordance with an aspect of the present invention.

DETAILED DESCRIPTION OF THE INVENTION

The present invention will be described herein in the context of illustrative methodologies using circuit image analysis and pattern identification in conjunction with principles of laminate theory for improving the prediction of warp in an organic chip carrier or substrate. Embodiments of the invention divide the substrate into a plurality of "tiles" and then generate an image for each tile which is representative of a circuit layer of the substrate. It is to be appreciated, however, that the techniques of the present invention are not limited to the specific methods and application shown and described herein. Rather, embodiments of the invention are directed broadly to improved techniques for generating a more accurate thermomechanical model representing a circuit or circuit structure.

While techniques of the present invention are described herein with specific reference to substrate warp prediction, it is to be appreciated that these techniques are not limited to such an application. Instead, embodiments of the invention may be well-suited for other applications, including, but not limited to, stress analysis. For this reason, numerous modifications can be made to the embodiments described herein, including, for example, elimination of one or more steps in an illustrative embodiment of the invention, and the results will still be within the scope of the invention. No limitations with respect to the specific embodiments described herein are intended or should be inferred.

Figure 1:
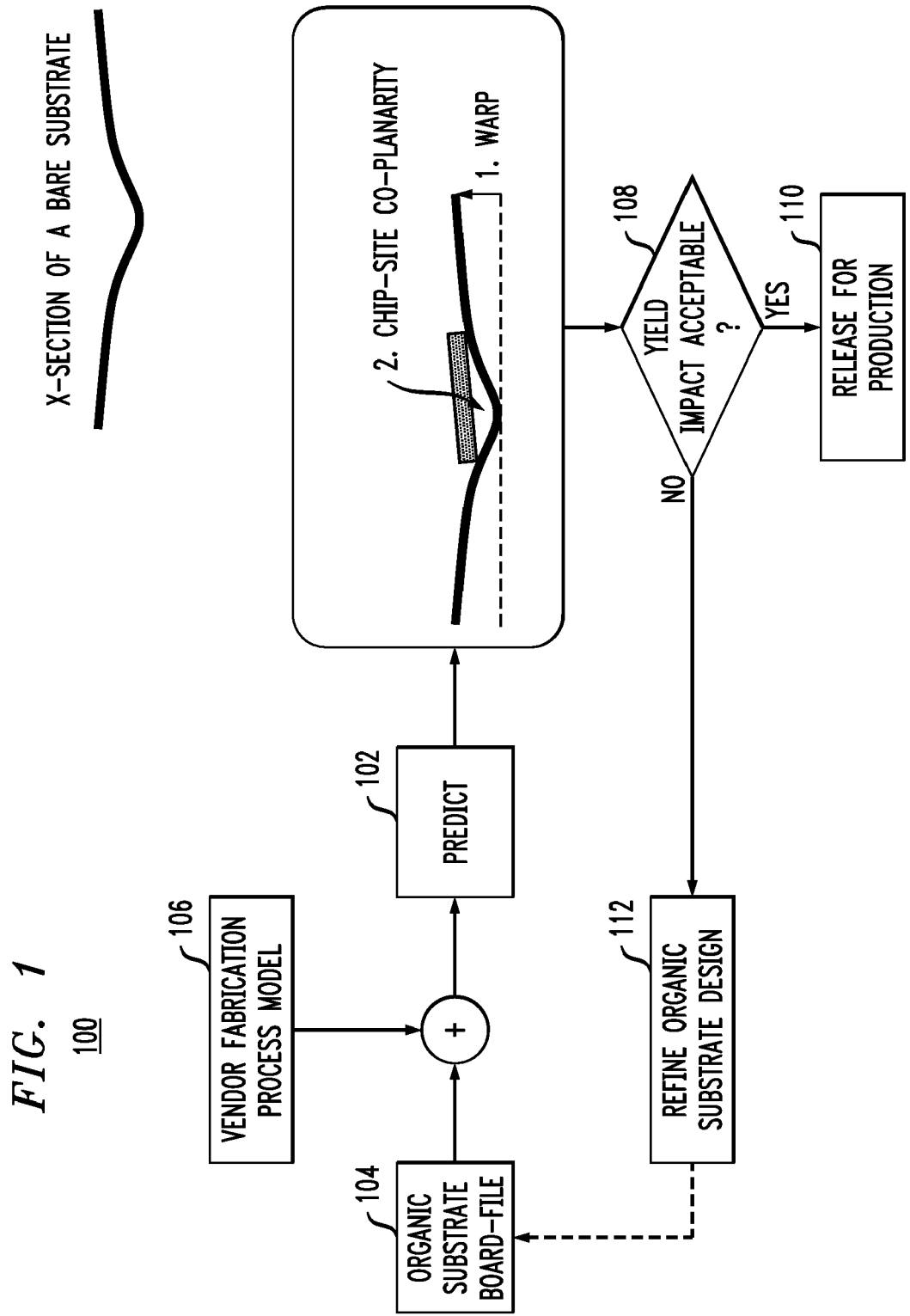
FIG. 1 is a conceptual block diagram depicting an exemplary chip design methodology in which techniques of the present invention can be implemented.

FIG. 1 is a conceptual block diagram depicting an exemplary chip design methodology 100 in which techniques of the present invention can be implemented. In accordance with chip design methodology 100, a prediction model is generated in block 102 as a function of both an organic substrate board file 104 and a vendor chip fabrication process model 106. The prediction model 102 preferably generates an estimation of organic substrate warp and chip-site co-planarity. If the estimated amount of substrate warp and/or chip-site co-planarity determined in block 102 is within prescribed acceptable limits for chip yield impact, as determined in step 108, the chip is released for fabrication (production) in step 110. Otherwise, the organic substrate design is refined in step 112, which will most likely involve modifying the organic substrate board file 104, and the process is repeated in an iterative manner as shown so as to minimize expected substrate warp prior to vendor fabrication.

Figure 2:
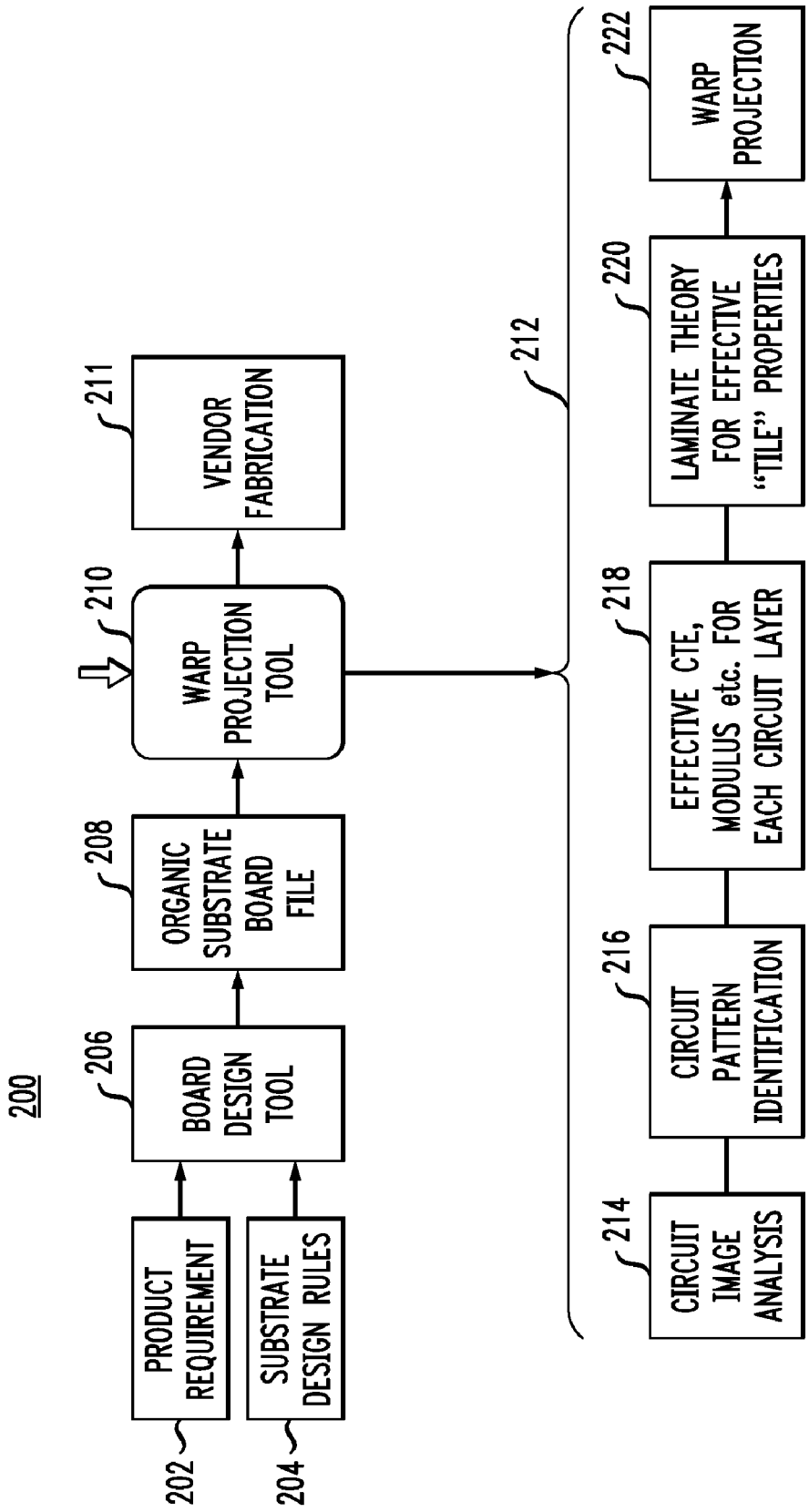
FIG. 2 is a conceptual block diagram depicting an exemplary chip carrier (substrate) design process including a warp projection methodology, in accordance with an embodiment of the present invention.

FIG. 2 is a flow diagram depicting an exemplary chip design method 200 including a warp projection methodology, 212, according to an embodiment of the invention. As apparent from the figure, product requirements 202 and substrate design rules 204 are incorporated by a board design tool 206 to generate an organic substrate board file 208. As previously explained, the board file includes, among other things, a geometric description of the organic substrate. The board file 208 is supplied to a substrate warp projection (e.g., estimation) tool 210 to determine whether or not to allow the chip design to proceed to vendor fabrication 211.

An organic substrate essentially comprises non-uniformly patterned metal layers, usually formed of copper. As used herein, the term "copper" may be used interchangeably with the term "metal," although it is to be understood that the metal or copper structures may alternatively be formed of other electrically conductive materials, and that such materials are within the scope of the present invention. By segmenting an organic substrate into a finite number of "tiles" (or alternative processing regions), as shown, for example, in FIG. 3, the distribution of the metal parameters in an x,y plane can be captured. Each tile preferably includes layers that represent copper circuit layers or resin layers (or other dielectric layers) used to separate two adjacent copper circuit layers.

Figure 3:
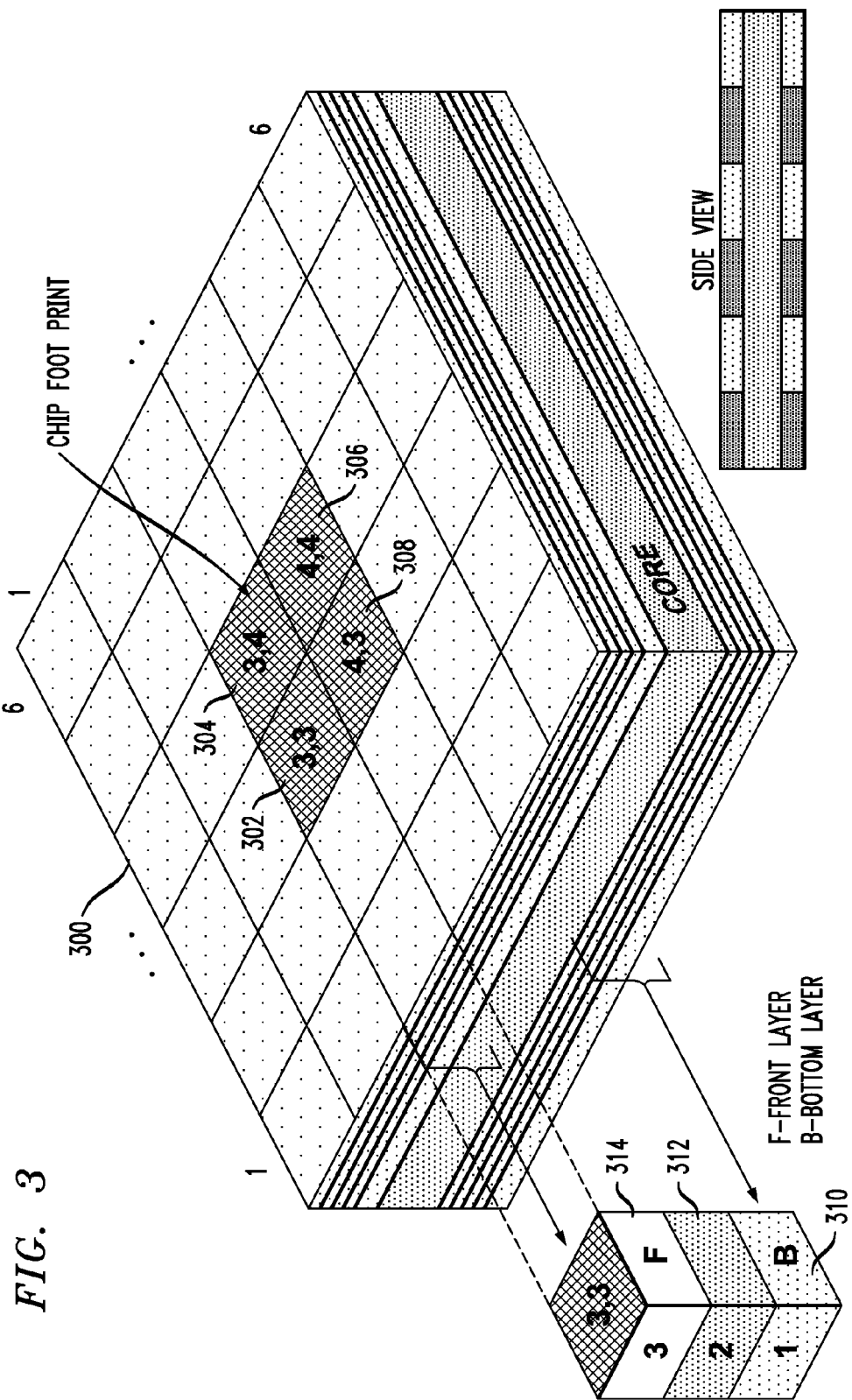
FIG. 3 is an isometric view depicting an exemplary organic substrate segmented into a plurality of tiles for prediction model generation, in accordance with an embodiment of the present invention.

With reference to FIG. 3, an isometric view depicting an exemplary organic substrate structure 300 is shown. The substrate 300 is segmented into 36 tiles arranged in a 6×6 array (e.g., six rows in an x-direction and six rows in a y-direction). A given tile may be arbitrarily assigned a unique x,y position in the array. For example, tile 302 may be designated as tile (3,3), since it is located at x position 3, y position 3. Similarly, tile 304 may be designated as tile (3,4), tile 306 may be designated as tile (4,4), and tile 308 may be designated as tile (4,3). In a preferred embodiment, the substrate 300 is divided into 12×12 equal size tiles. As the number of tiles into which the substrate 300 is divided is decreased, the amount of memory required to store all of the geometric parameters associated with a given tile increases accordingly, since the number of circuit features (geometries) within the given tile generally increases with tile size. It is to be appreciated, however, that the invention is not limited to any specific number of tiles into which the substrate 300 may be divided. Furthermore, a footprint of any given tile need not be square (as shown), but rather may be rectangular.

Each x,y zone (for example 3,3) preferably includes three tiles in a z direction (e.g., cross section), namely, a first tile 310, which may include all bottom circuit (BC) layers, a second tile 312, which may be a core, and a third tile 314, which may include all front circuit (FC) layers. More particularly, each of the tiles 310 and 314 preferably forms a sandwich structure including a plurality of circuit layers, with a dielectric insulating layer formed between any two adjacent circuit layers for electrically isolating the circuit layers from one another. The core layer 312 may also comprise multiple layers. The invention is not limited to any specific number of circuit layers and/or core layers forming the substrate 300.

As shown in FIG. 2, warp projection tool 210 is operative to perform an exemplary warp projection methodology 212. Warp projection method 212 includes a circuit image analysis step 214 followed by a circuit pattern identification step 216. Circuit image analysis 214 may include, for example, obtaining an image of the organic substrate structure (e.g., from a board file or alternative geometric description file) and segmenting the organic substrate into a plurality of tiles based, at least in part, on x,y coordinates of circuit structures defined in the board file or alternative geometric description file. Circuit pattern identification 216 may include, for example, receiving a circuit layer image from the circuit image analysis step 214 and identifying one or more geometric features in the circuit layer image so as to facilitate thermomechanical parameter extraction of the identified features in a subsequent processing step.

Based on the circuit pattern identification information generated in step 216, one or more thermomechanical parameters (e.g., effective coefficient of thermal expansion (CTE), modulus, Poisson's ratio, etc.) are determined in step 218 for each layer of the organic substrate, such as by using an analytical process. Based on principles of laminate theory, and using computed parameters (e.g., stored in look-up tables, etc.) corresponding to the various layers, a 3-D model representing the substrate is constructed for each tile in step 220. The 3-D model is then used in step 222 to determine a warp projection for the organic substrate. This warp projection may be used in determining whether or not to allow a design to proceed to fabrication. Each of these functional steps will be described in further detail below. It is to be appreciated that, while the warp projection tool 210 is illustrated herein as being comprised of individual functional blocks (e.g., 214, 216, 218, 220, 222), at least one of these functional blocks may be combined with one or more other functional blocks in implementing the warp projection methodology.

Figure 4:
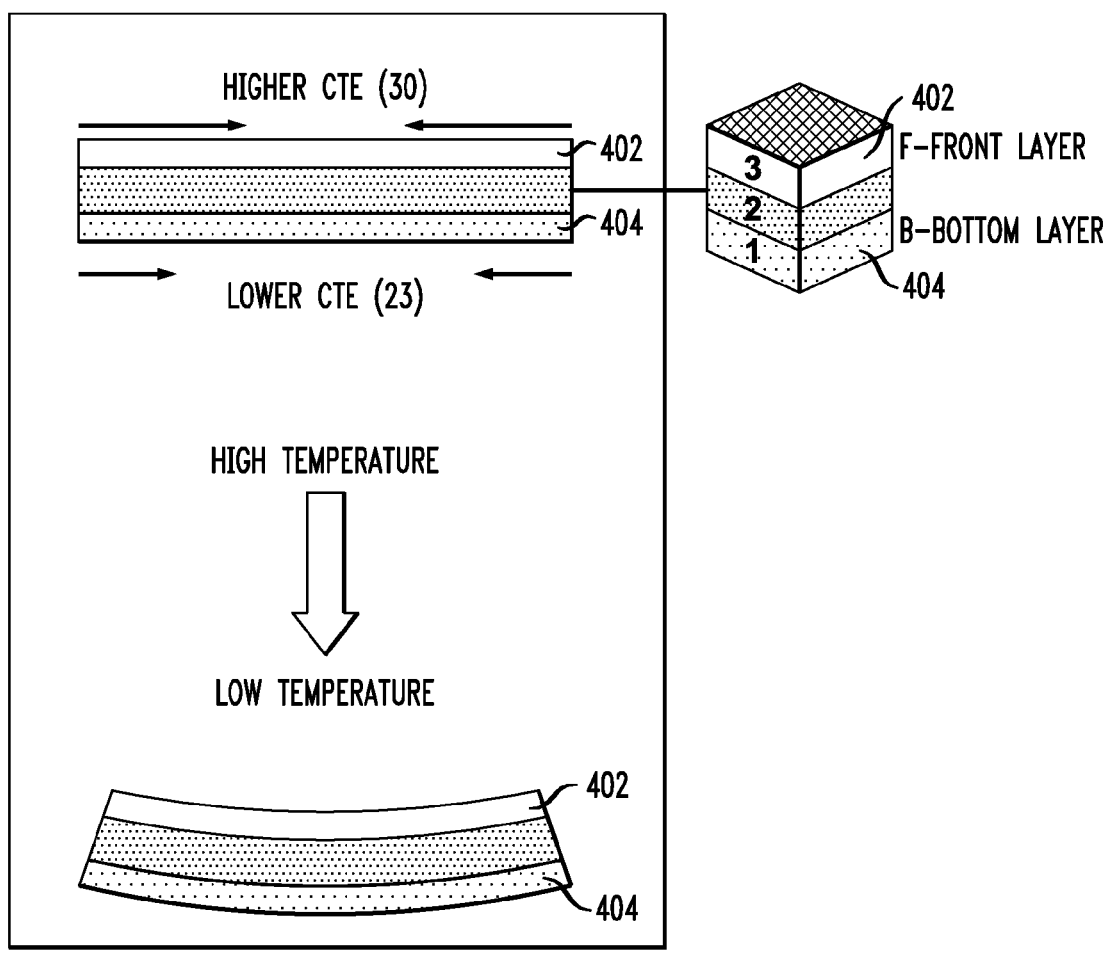
FIG. 4 is a conceptual representation of a mechanism driving temperature-dependent warp of an organic substrate, in accordance with an aspect of the invention.

In order to project warp of the organic substrate, the CTE of each tile is computed. With reference to FIG. 4, a conceptual representation 400 of a mechanism driving temperature-dependent warp of an organic substrate is illustrated. By way of example only, assume that the CTE of a top tile 402 in an organic substrate is about 30 parts-per-million per degree Kelvin (ppm/° K) in comparison to a bottom tile 404 having a CTE of about 23 ppm/° K, the substrate in that region of the tile can be expected warp upwards as it is cooled down from a high temperature condition to, for example, room temperature.

Figure 5:
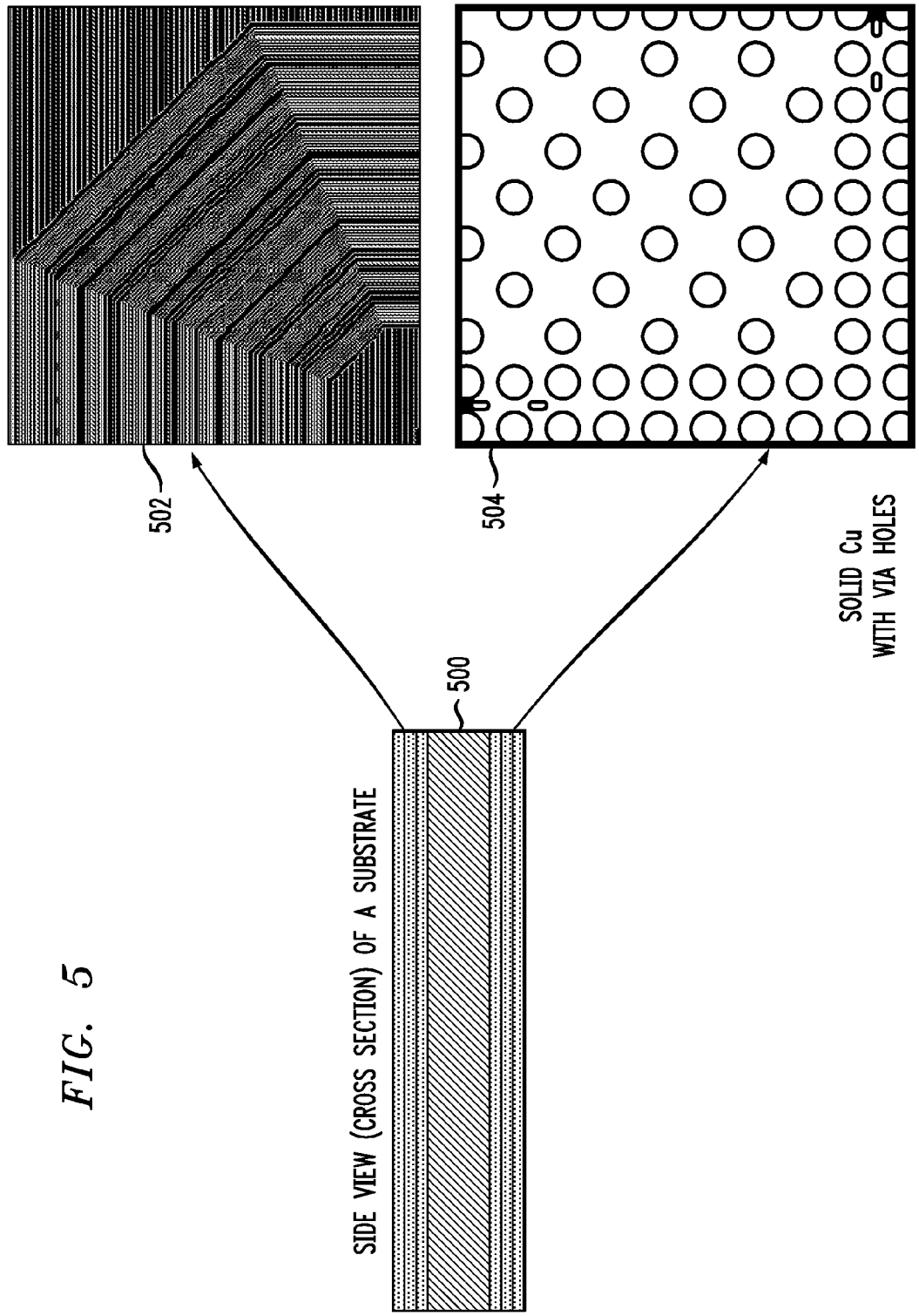
FIG. 5 is a cross-sectional view depicting at least a portion of an exemplary organic substrate along with corresponding top plan views depicting two exemplary layers within a tile of the substrate, in accordance with an aspect of the present invention.

As previously stated, a tile of the organic substrate is preferably comprised of multiple circuit layers separated by resin layers. FIG. 5 is a cross-sectional view depicting at least a portion of an exemplary organic substrate 500 along with corresponding top plan views depicting two exemplary layers within a tile of the substrate, according to an aspect of the invention. A first circuit layer 502 may include, for example, patterned copper lines, and a second circuit layer 504 may include solid copper with via holes formed therein. Each of these circuit layers will exhibit significantly different thermomechanical behaviors due primarily to the different physical construction of the individual layers. Moreover, since projection of warp depends, to a large extent, on an accurate characterization of thermomechanical properties of the substrate, it is important to have a sufficient number of tiles in building up a representative model of the substrate. Preferably, for the current substrate, 144 tiles (e.g., arranged in a 12×12 array) can adequately capture the thermomechanical properties of the substrate, although the invention is not limited to any particular number of tiles. Manual estimation of copper parameters layer-by-layer is too time consuming.

Embodiments of invention advantageously present an automated method for performing thermomechanical parameter estimation of an organic substrate. Particularly, the copper content and pattern type are estimated so that a complex and non-uniform circuit layer can be identified, for example, using image processing means. This model building method is highly automated for warp projection purposes.

Figure 6:
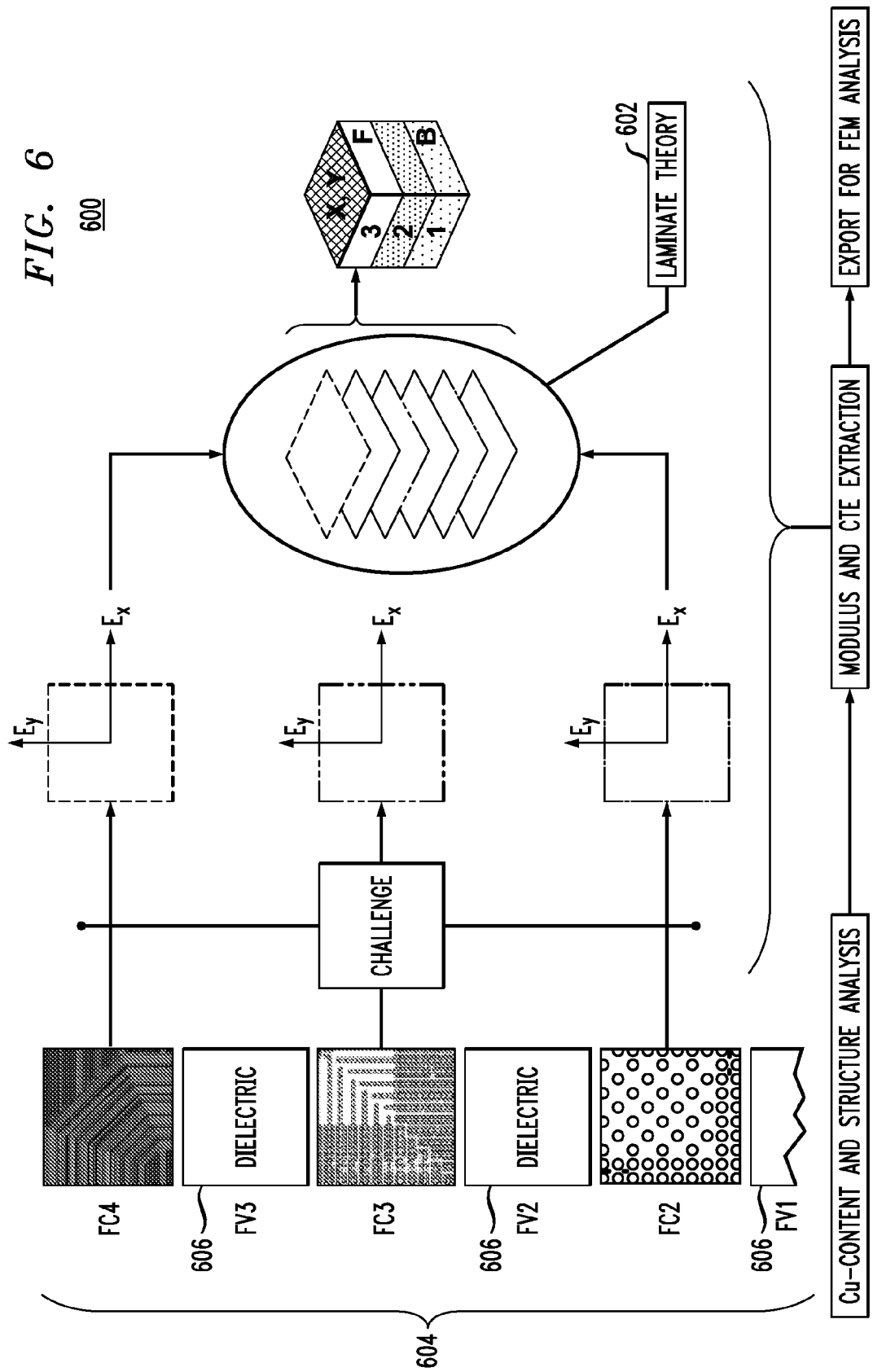
FIG. 6 depicts a conceptual representation of an exemplary method for developing a warp projection model using image files and established laminate theory, in accordance with an embodiment of the present invention.

FIG. 6 is a conceptual view depicting an exemplary method 600 of applying principles of laminate theory 602 to obtain thermomechanical properties for each tile of an organic substrate, according to an aspect of the invention. Method 600 preferably provides a systematic approach to developing a warp projection model using principles of laminate theory.

Laminate theory, in the general sense, has been employed to study products having multiple layers of material joined together. However, a restriction in conventional applications of laminate theory is that each of the layers be formed using a uniform structure. For example, a cross-ply laminate structure (e.g., consisting of an arbitrary number of layers of the same material and thickness but with alternating orientations of 0° and 90°) formed using fiber-reinforced plastic, can be analyzed using existing tools. An organic substrate, in contrast, is comprised of multiple layers 604, but with each circuit layer having highly non-uniform circuit patterns. Dielectric layers 606 may be treated as being substantially uniform. Hence, in applying principles of laminate theory to an organic substrate, one challenge is in converting the complex organic substrate structure into an equivalent orthotropic representation so that subsequent warp model building can be undertaken.

Figure 7:
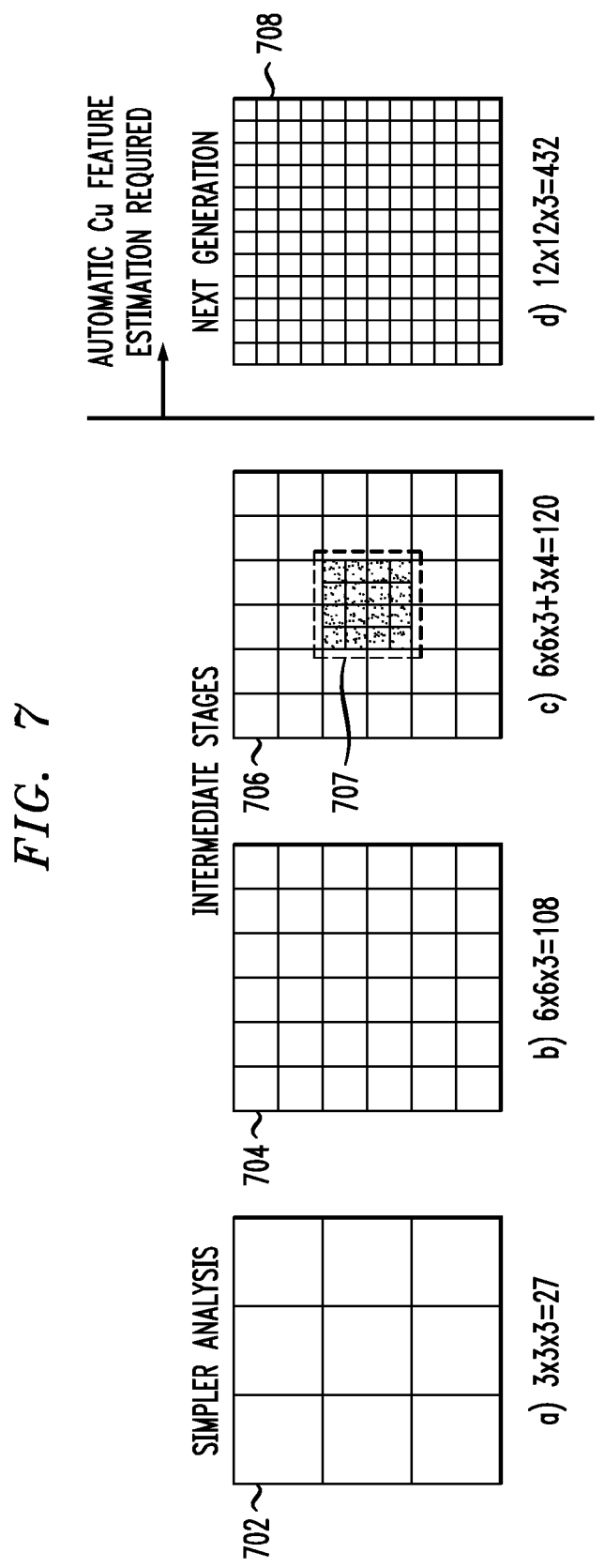
FIGS. 7A through 7D show a conceptual representation of the resolution to be considered within a tile for automatic geometric feature estimation, in accordance with an embodiment of the present invention.

FIGS. 7A through 7D show a conceptual representation of the level of resolution to be considered within a tile for automatic geometric feature estimation, in accordance with an embodiment of the present invention. In FIG. 7A, a 3×3 tile representation 702 is shown which is capable of capturing 27 parameters (assuming three parameters per tile. This tile representation has a fewer number of layers to process, and therefore provides a faster computation time, but it cannot adequately capture local variations in copper content and structure. Intermediate tile representations 704 and 706 are shown in FIGS. 7B and 7C, each arranged as a 6×6 array, capable of capturing 108 and 120 parameters, respectively. Some unique divisions of one or more tiles in an array can also be considered for increasing resolution by a desired amount, an example of which is shown in FIG. 7C. In tile representation 706, an area 707, which may be directly under a die, is preferably provided with more resolution to capture anticipated drastic changes in copper pattern. Thus, resolution need not be the same throughout the entire substrate. From experience in analyzing organic substrates, it can be shown that a 12×12 tile representation 708, shown in FIG. 7D, provides a good trade-off between resolution and number of distinct layers that need to be processed.

Figure 8:
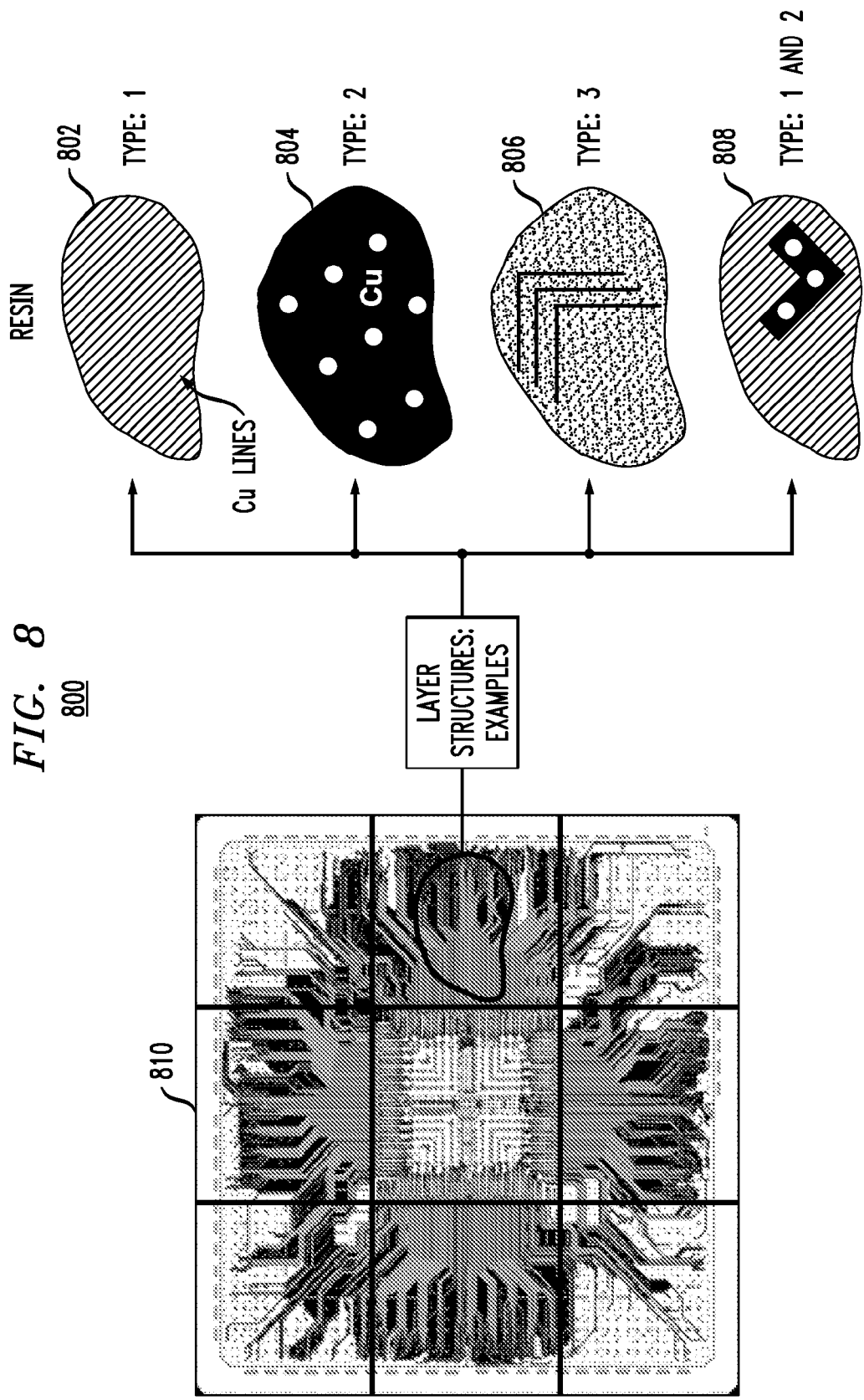
FIG. 8 conceptually illustrates an exemplary process for identifying structures in a tile of an organic substrate, according to an embodiment of the present invention.

As part of the circuit pattern identification process (e.g., step 216 in FIG. 2), once a decision on tile size (resolution) is made, a key challenge is in developing a methodology to identify copper patterns or alternative geometric features using, for example, image processing techniques. FIG. 8 conceptually illustrates an exemplary process 800 for identifying structures in a tile of an organic substrate, according to an aspect of the present invention. For example, a subset of exemplary patterns, 802, 804, 806 and 808, found in at least a portion of a circuit layer 810 are shown. By way of example only, patterns 802, 804 and 806 may exhibit arbitrarily designated type 1, 2 and 3 patterns, respectively, with an identifiable dominant feature, whereas pattern 808 exhibits multiple features (in this case, two) drawn from types 1 and 2 and may pose a challenge in identifying the circuit structure using an automated process. Thus, it is advantageous to identify complex features of a given circuit layer under essentially all conditions for the warp projection method to be automatable. Under conditions when, for instance, multiple pattern types are encountered, a criteria is preferably developed to represent the thermomechanical properties of the multiple pattern types.

Figure 9:
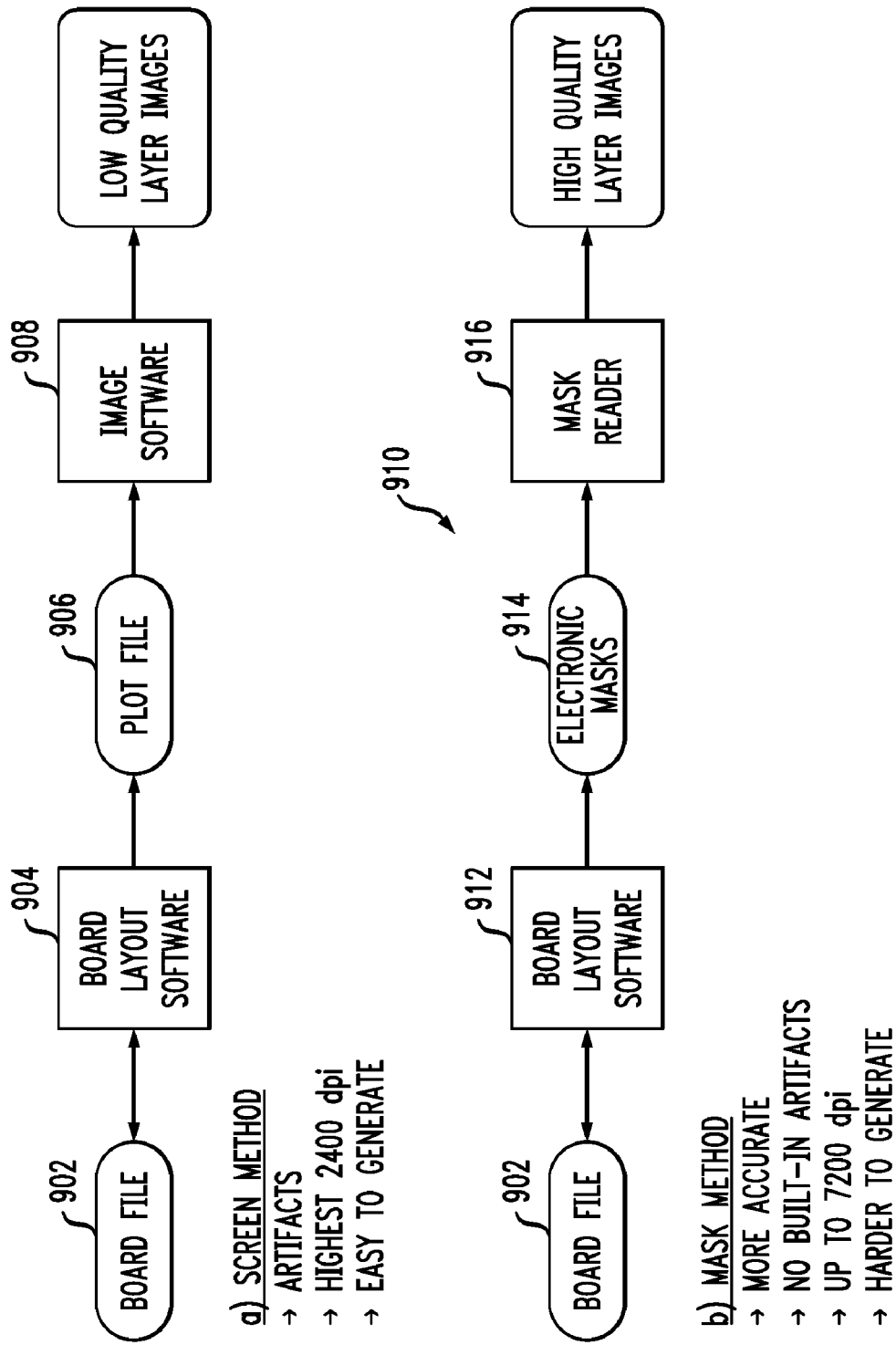
FIG. 9 is an exemplary block diagram conceptually depicting bitmap images and electronic masks of layers of the organic substrate obtained from the screen-output function of board layout software read using traditional image software and mask-reading software, in accordance with aspects of the present invention.

With reference now to FIGS. 9A and 9B, an input to block 214 of the illustrative warp projection methodology 212 may comprise a bitmap image (or images) of the respective layers of the organic substrate. As shown in FIG. 9A, these images can be obtained, for example, from a board file 902 using a screen-output function of board layout software 904. The software output is a typically a plot file 906 which can be read by commercial imaging software 908. This method can currently yield up to about 2400 dpi (dots per inch) images and is vulnerable to copper estimation and image identification errors.

Since it is desirable that high quality images are generated, an alternative method 910 shown in FIG. 9B for generating input images for subsequent analysis by the warp projection method is preferably used. Method 910 is based on electronic mask outputs that are used for substrate manufacturing, rather than on plot files as in the method shown in FIG. 9A. More particularly, method 910 preferably receives the board file 902 which includes a geometric description of the organic substrate and, using board layout software 912, generates an electronic mask output 914. The mask generating process, unlike a screen-output of an image which is readily available for an analyst, requires a mask reader 916 for converting the mask output to a form suitable for use by a subsequent processing block in the warp projection method. Using the mask method 910, a resolution of up to about 7200 dpi can be achieved, substantially without any artifacts.

Figure 10:
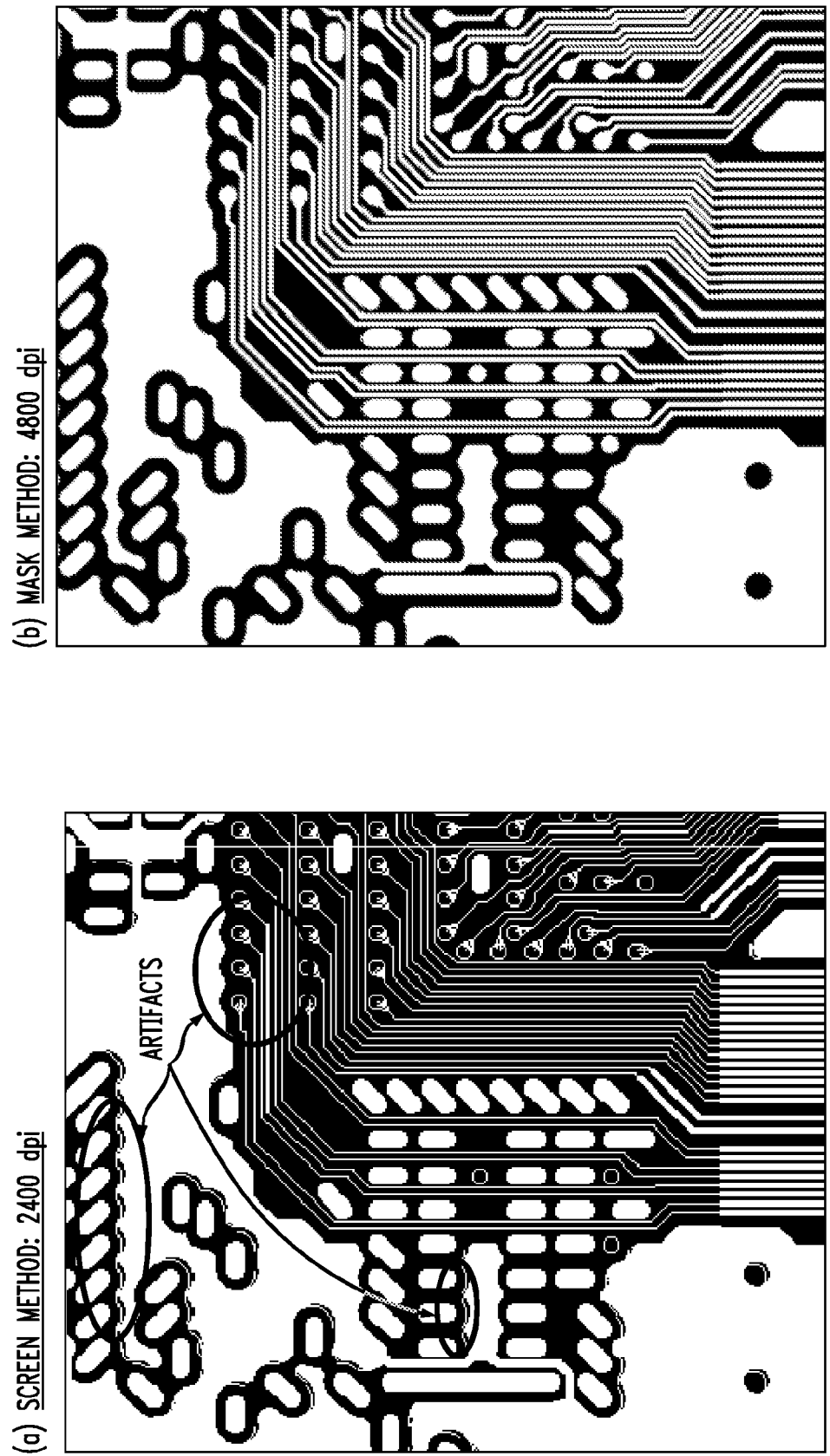
FIGS. 10A and 10B illustrate a side-by-side comparison of images generated from bitmap files and mask files, respectively, in accordance with aspects of the present invention.

FIGS. 10A and 10B illustrate a side-by-side comparison of images generated from bitmap files and mask files, respectively, in accordance with aspects of the present invention. The image shown in FIG. 10A is generated using a screen method (FIG. 9A) having an image resolution of 2400 dpi. The image shown in FIG. 10B is generated using a mask method (FIG. 9B) having an image resolution of 4800 dpi. As apparent from FIG. 10A, artifacts are introduced by the screen function itself. The resolution effect is highlighted in the rectangular box, which shows lines with incorrect width.

Figure 11:
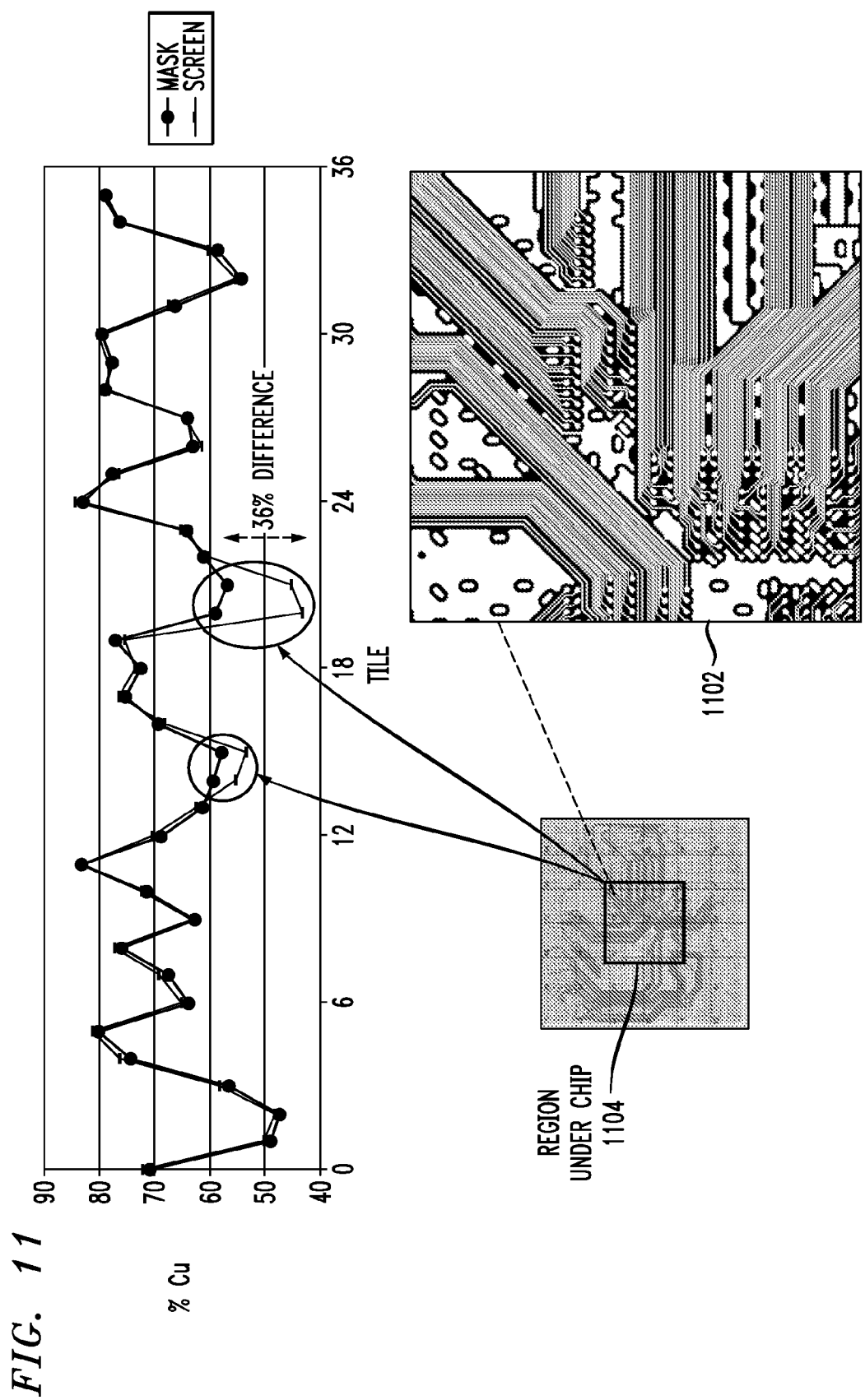
FIG. 11 depicts a graph showing the difference in estimated copper percentages between the bitmap and mask image generation methods, according to aspects of the present invention.
Figure 12:
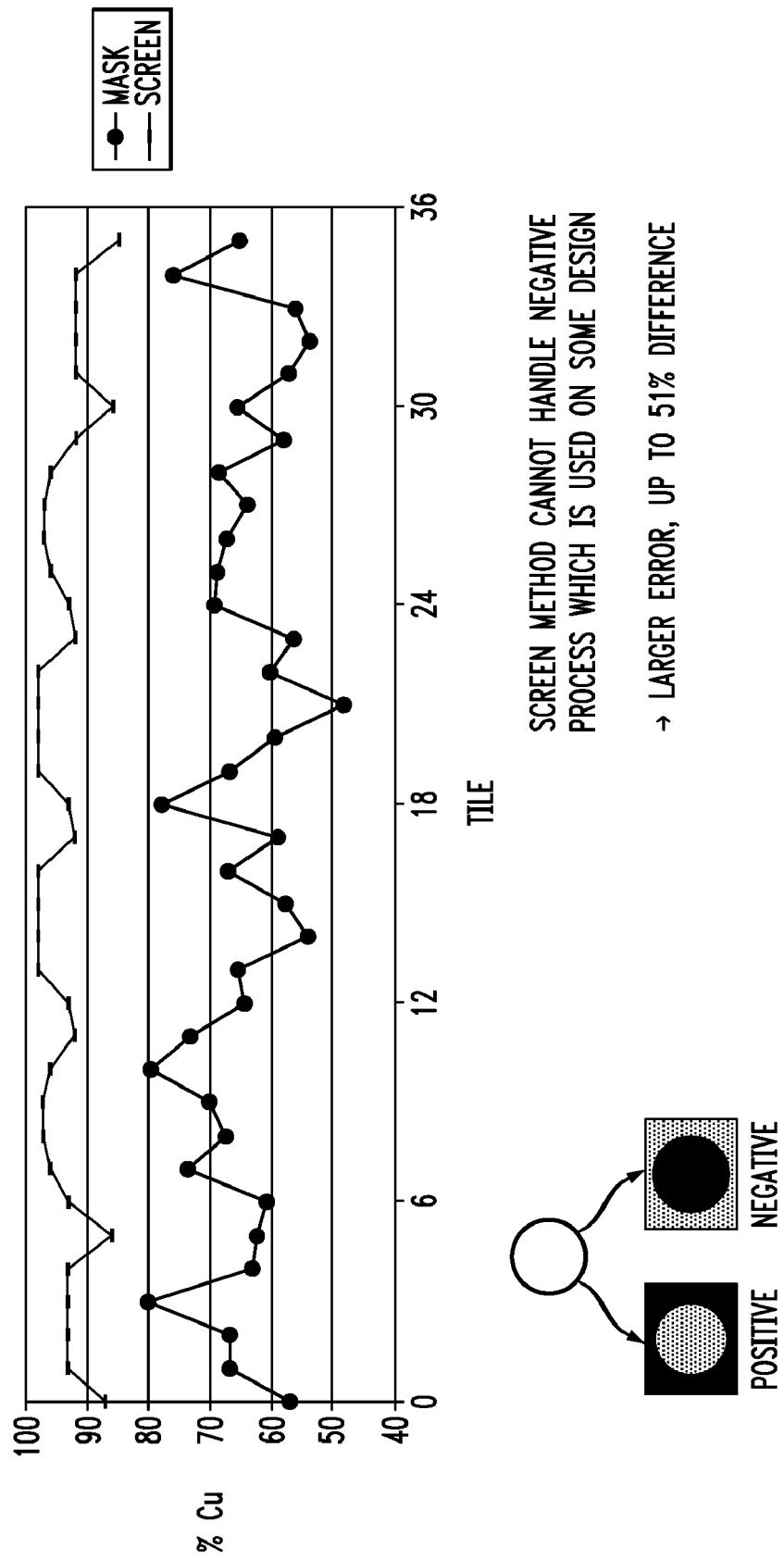
FIG. 12 depicts a graph showing the difference in estimated copper percentages between the bitmap and mask image generation methods on core layers, according to aspects of the present invention.

By way of example only and without loss of generality, using the two types of images shown in FIGS. 10A and 10B, with the same copper percentage (Cu %) measurement tool, it can be seen that overall there is not much difference for most tiles. However, for the center region under the chip (i.e., the area within the highlighted rectangle), which has a multitude of complex features and fine lines, there can be a significant difference between the two image generation methods, namely, up to about 36% difference in the estimated value of copper content. The bitmap image 1102 in FIG. 11 represents the tile at the upper-right corner of the chip footprint 1104. Similarly, with reference to FIG. 12, the core layer of the substrate is compared for the two imaging methods (e.g., screen method vs. mask method). As apparent from FIG. 12, the difference between the two approaches is even larger for the core layer (e.g., about 51%) which uses a negative etch process (i.e., etch away drawn feature). In this case, the screen process does not invert the image as it should.

Figure 13:
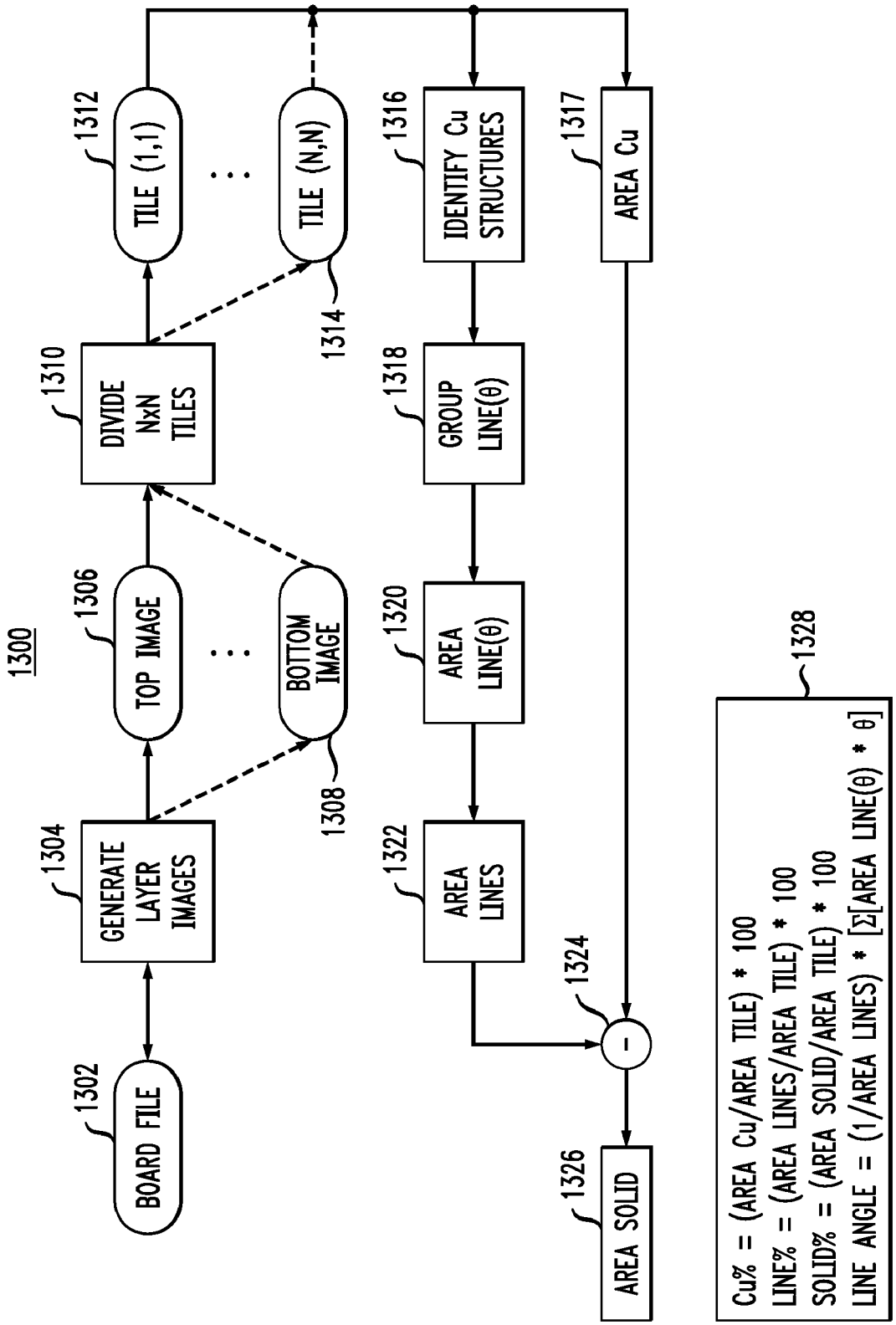
FIG. 13 is a block diagram conceptually illustrating an exemplary method for computing copper percentage and orientation, in accordance with an embodiment of the present invention.

FIG. 13 is a block diagram conceptually illustrating an exemplary method 1300 for computing copper percentage and orientation, in accordance with an embodiment of the invention. Specifically, images corresponding to an organic substrate are obtained, for example, from a board file 1302, or an alternative image source. Board images for each layer are then generated in block 1304. Exemplary processes for generating board images, such as, for example, using a mask image generation method, was described previously (see, e.g., FIG. 9). Images generated in block 1304 preferably include a top image 1306, a bottom image 1308, and intermediate layer images corresponding to the substrate.

Each image 1306, 1308 generated in block 1304 is divided into N×N tiles, where N is an integer greater than one. In a preferred embodiment of the invention, N=12, although the invention is not limited to any particular number or organization of tiles. As shown in FIG. 3, each tile (e.g., tiles 1312 through 1314) may be assigned a unique (x,y) position in the substrate, and each tile is preferably processed individually in order to reduce processing overhead otherwise required. For each tile, a software tool, or alternative processor, is preferably operative to receive the tiles 1312, 1314 and to classify the copper structures, or alternative geometric features, for example, into lines and solids, as will be described in further detail below.

In block 1316, copper structures, which may include lines or other geometric structures, are identified. In block 1317, total copper area (AreaCu) of a tile is determined, which can be computed by counting all pixels in the tile. Lines of the same angle (θ) identified in block 1316 are grouped together in block 1318, and their respective areas are added in block 1320 to obtain a total copper area of all lines (AreaLines) in block 1322. Line angles can vary between 0° and 180°, although for most designs, lines are formed using a limited number of angles, such as, for example, 0°, 45°, 90° and 135°. A difference between the total copper area of the tile (AreaCu), determined in block 1317, and the total copper of the lines identified in the tile (AreaLines), determined in block 1322, is computed in block 1324, which may be implemented using a comparator, to generate a result (AreaSolid) in block 1326 indicative of this difference. Expressions 1328 which may be used in calculating the copper percentage of various elements in the tile are shown at the bottom of FIG. 13. As used in the expressions 1328, the term LineAngle is indicative of an average angle of all lines, weighted by the areas of lines of the same angles.

Figure 14:
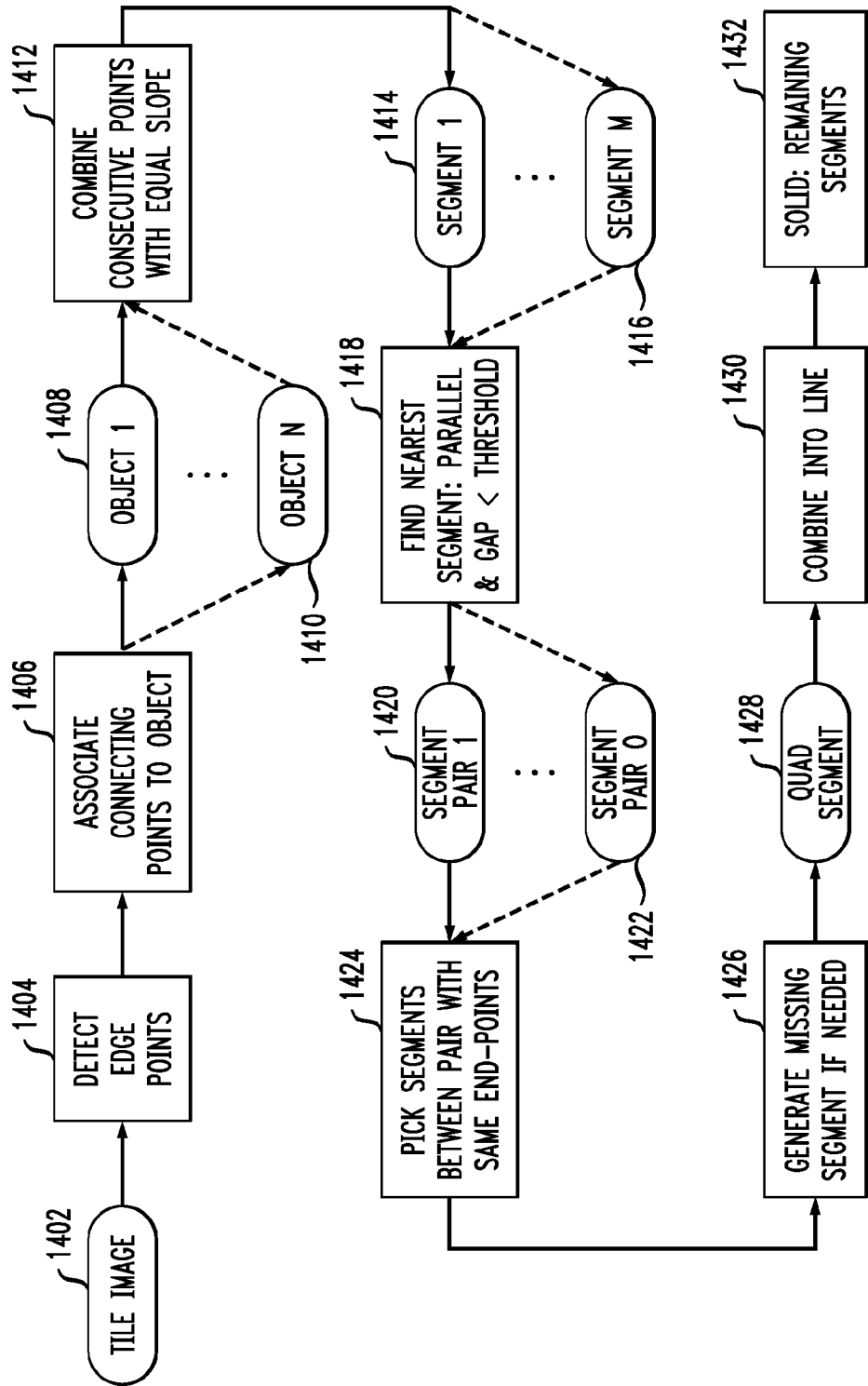
FIG. 14 is a block diagram conceptually illustrating an exemplary method for identifying copper structures on a tile by combining edge points to identify lines, in accordance with an embodiment of the present invention.

Copper structure extraction can have certain challenges to be overcome. FIG. 14 is a block diagram illustrating an exemplary method 1400 for identifying copper structures on a tile by combining edge points to identify lines, in accordance with an embodiment of the invention. Starting with a given tile image 1402, which may be a bitmap image, a first step, 1404, is to identify the edges of all objects. Since this is a bitmap image, the edges are made up of a collection of points, which may be referred to herein as "edge points." There are many algorithms known to those skilled in the art which are suitable for detecting edges, usually by convolving an image with a set of filters and comparing the output to a threshold. Image bits with the highest gradient, having a gradient above a prescribed threshold, are considered edges. This is needed for color and grayscale images. To simplify this operation, the bitmap image can be constrained to have only two values (e.g., white and dark). Using such a binary image assignment, the edge bits can be detected using a logical exclusive-OR (XOR) operation on neighboring bits.

The edge bits that are connected to each other are grouped into a linked list in step 1406. These are the edges defining one object. Each object 1408, 1410 may be made up of a collection of lines or lines and solids that are connected to each other. There may be multiple objects in one tile.

For each object, consecutive edge points of equal slope are combined into one segment in step 1412. There may be many segments 1414, 1416 in one object. In step 1418, the nearest segments having substantially the same slope that are close to each other, for example, within a prescribed threshold distance from one another (e.g., gap<threshold), form a segment pair. The two ends of a segment pair are connected with segments that are in between the segment pair in step 1424. If no nearest segments are available, a new segment can be generated in step 1426. The goal is to find four segments (e.g., quad segment) 1428 which encloses an area and forms a line in step 1430. Once all segment pairs are processed, all lines have been found and the remaining segments belong to the solid area (step 1432). Threshold value can be experimentally determined, starting out with a prescribed minimal line width and then iteratively increasing the line width until all lines are recognized. Alternative methods for determining the threshold value are similarly contemplated.

Figure 15:
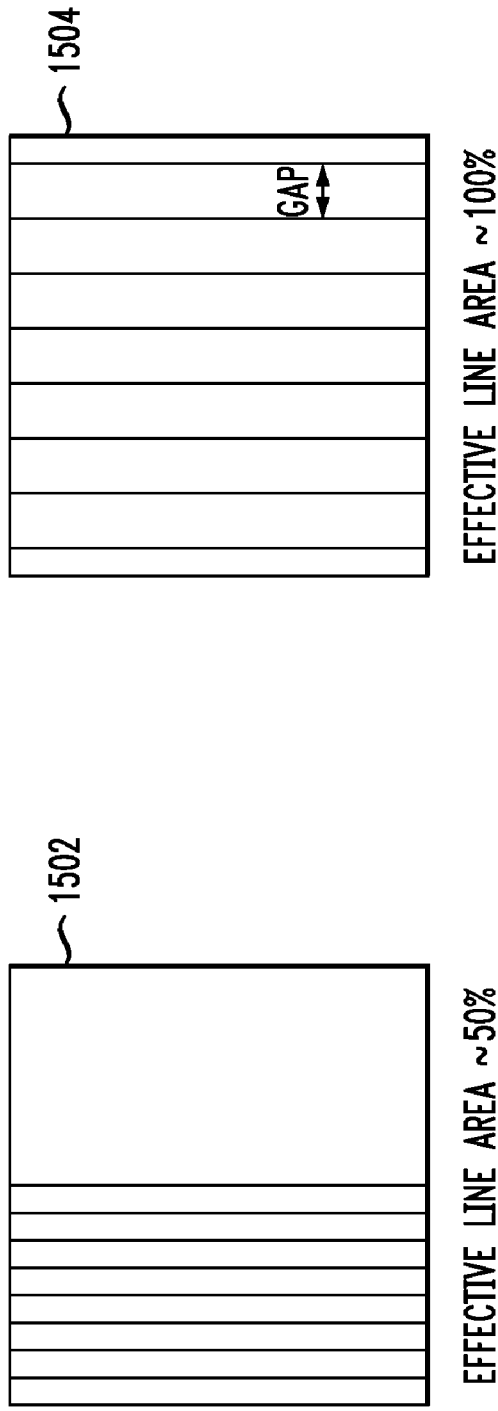
FIG. 15 is a representation of effective line area by combining the area of parallel lines with the area of gaps, according to an aspect of the invention.

Some tiles have many thin lines that cover a large area, but the total copper area of these lines could still be relatively small. FIG. 15 conceptually illustrates this scenario. Both tiles 1502 and 1504 have the same number of vertical lines of the same thickness. Consequently, the copper and line areas are the same, but the effect on CTE is very different. To take this into account, an effective line area of the tile is preferably introduced, according to an aspect of the invention, which may be defined as the total area enclosed by neighboring parallel lines and the spaces in between (gap). For non-parallel lines, the effective line area and the line area will essentially be the same. Effective line areas can be employed when comparing copper areas of lines and solids to determine which model to use. This approach also preferably looks at the collection of lines to detect special patterns that may require special handling by the FEA software.

Figure 16:
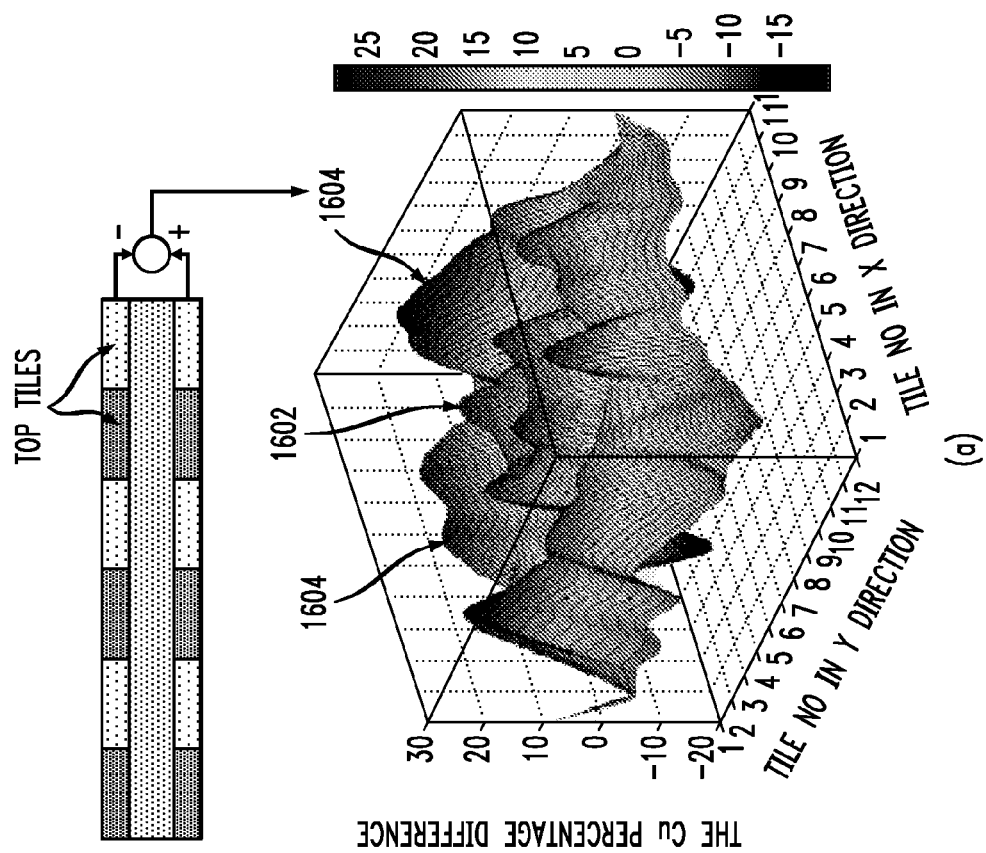
FIGS. 16A and 16B depict an exemplary 3-D graphical representation of copper imbalance between top and bottom tiles in circuit pattern type-3 of FIG. 8C, in accordance with an embodiment of the present invention.

FIGS. 16A and 16B depict an exemplary 3-D graphical representation of copper imbalance between top and bottom tiles in circuit pattern type-3 (see pattern 806, FIG. 8), in accordance with an embodiment of the present invention. The copper content of the core is excluded in this computation. As apparent from FIG. 16A, the zone near the chip footprint 1602 has substantial copper imbalance which drives the thermal warp. The copper imbalance on the edges 1604 of the chip footprint, even though comparable to that in the chip footprint area, does not correspondingly contribute to warp as there is not much of a "lever-arm" effect from the copper imbalance zone to the edge of the substrate.

FIG. 16B shows the effect of the circuit pattern (type-3 pattern 806 of FIG. 8) that dominates the chip footprint in this example. As apparent from FIG. 16B, there is a high correlation between measured thermal warp 1606 and projected thermal warp 1608 employing the copper content and pattern detection methodologies described herein.

In this illustrative example, type-3 pattern was carefully handled. Certain manual intervention was required to insert the effect of "true" type-3 pattern. However, this requirement limits the ability of the pattern detection software to run automatically. Line detection software for type-3, when allowed to run in an automated mode, will only produce a single effective line angle (e.g., either 45° or 135°), whereas the true pattern includes multiple continuous lines with a 90° bend. In order to study the impact of automation with inherent approximations present in the estimation of line angles, additional analysis was pursued.

Figure 17:
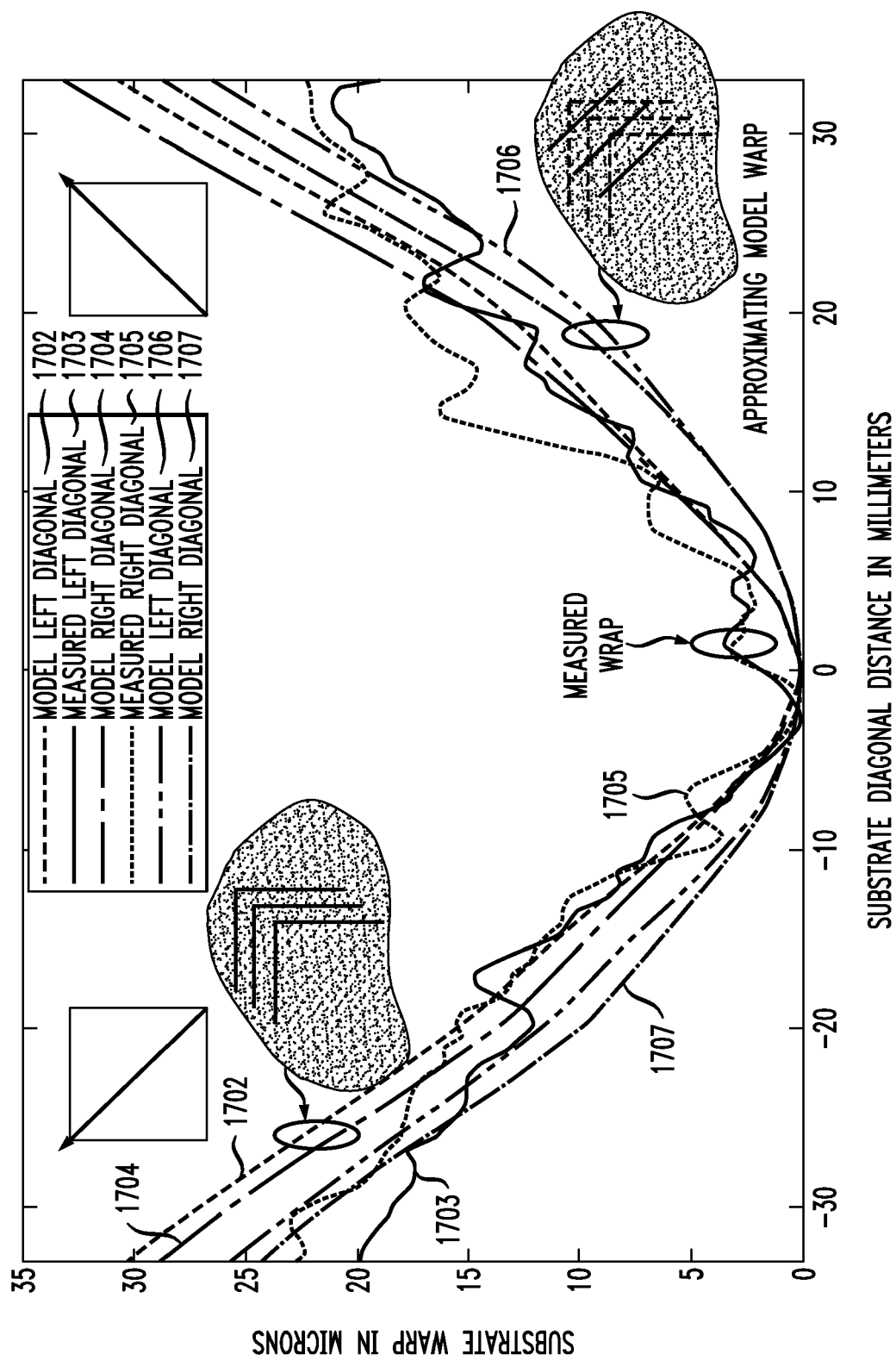
FIG. 17 depicts a graphical representation of the projected thermal warp of the type-3 pattern from FIG. 8c when manually programmed and effective line angles of type-3 pattern when automatically produced, in accordance with an embodiment of the present invention.

FIG. 17 depicts an exemplary graphical representation of projected thermal warp of the type-3 pattern 806 from FIG. 8 (manually programmed) and effective line angles of type-3 pattern (automatically produced), in accordance with an embodiment of the present invention. In the graph, trace 1702 represents model left diagonal, trace 1703 represents measured left diagonal, trace 1704 represents model right diagonal, trace 1705 represents measured right diagonal, trace 1706 represents model left diagonal, and trace 1707 represents model right diagonal. As apparent from the figure, the general trend in warp is preserved in both cases, however, the automated version produces slightly lower than measured chip-site warp while projecting better estimates of overall warp.

The above example is presented to demonstrate that there is a slight trade-off between automatic image generation and accuracy of warp projection. The image processing methodology employed in accordance with techniques of the invention can be optionally structured to prompt the analyst whenever an image is compromised due to automation, and then allow the analysis to insert the appropriate image and property characteristics manually.

FIG. 18 is a graphical representation of image classification based on the percentage of copper lines and image processing complexity, in accordance with an aspect of the invention. FIG. 18 highlights certain complexities of pattern detection. For example, when the image is mostly solid copper with a minimum amount of copper lines (e.g., less than about 20%), the image can be classified as a type-2 pattern 804 (see FIG. 8). Alternatively, if the copper content is made of, for example, greater than about 60% of lines, then the image can be classified as a type-1 pattern (see FIG. 8). The challenge of sorting the image becomes complex when type-1 and type-2 geometries are present in comparable measures. In this case, the image processing method preferably generates a default pattern type that is understood by the subsequent model building process.

At least a portion of the techniques of the present invention may be implemented in one or more integrated circuits. In forming integrated circuits, die are typically fabricated in a repeated pattern on a surface of a semiconductor wafer. Individual die are cut or diced from the wafer, then packaged as integrated circuits. In packaging the dies, individual die are attached to a receiving substrate according to methods of the invention. One skilled in the art would know how to dice wafers to produce integrated circuits. Integrated circuits so manufactured are considered part of this invention.

An integrated circuit formed in accordance with techniques of the present invention can be employed in essentially any application and/or electronic system in which accurate prediction of thermomechanical properties of an organic substrate are desired. Suitable systems for implementing the invention may include, but are not limited to, personal computers, test and measurement equipment, portable communications devices, etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A method of characterizing an organic substrate including a plurality of circuit layers, the method comprising the steps of:

receiving an image of the organic substrate, the image including a geometric description of the plurality of circuit layers of the substrate;

segmenting the organic substrate into a plurality of processing regions based, at least in part, on geometric coordinates of circuit structures defined in the image of the substrate;

generating a circuit layer image corresponding to a selected one of the processing regions of the substrate;

identifying one or more geometric features in the circuit layer image;

estimating at least one thermomechanical property of the circuit layer image as a function of the one or more identified geometric features;

repeating the steps of receiving an image, generating a circuit layer image, identifying one or more geometric features in the circuit layer image, and estimating at least one thermomechanical property of the circuit layer image until all circuit layers in the substrate have been processed; and generating a three-dimensional representation of the selected one of the processing regions of the substrate including the plurality of circuit layer images as a function of the at least one thermomechanical property of each of the plurality of circuit layer images, wherein the method steps are performed by a computer.

2. The method of claim 1, further comprising optimizing a design of the organic substrate by iteratively modifying at least one parameter of the substrate as a function of the three-dimensional representation of the selected one of the processing regions of the substrate.

3. The method of claim 1, further comprising the steps of:

providing a set of product requirements for the organic substrate to a board design system;

providing a set of design rules to said board design system, wherein at least one parameter used by said board design system is controlled as a function of the set of design rules; and the board design system generating an organic substrate board design file, the board design file including the geometric description of features corresponding to the substrate.

4. The method of claim 1, wherein the step of generating a three-dimensional representation of the selected one of the processing regions of the substrate comprises repeatedly stacking circuit layer images using one or more principles of laminate theory.

5. The method of claim 1, wherein the step of segmenting the organic substrate into a plurality of processing regions comprises selecting a number of regions into which the substrate is divided to thereby control an image processing resolution.

6. The method of claim 5, wherein the number of regions into which the substrate is divided varies throughout the substrate as a function of a level of detail to be captured in a given circuit layer image corresponding to the substrate.

7. The method of claim 1, wherein the image of the organic substrate comprises a bitmap image.

8. The method of claim 1, wherein the image of the organic substrate comprises a board file.

9. The method of claim 1, wherein the step of identifying one or more geometric features in the circuit layer image comprises characterizing separately the circuit layer images to determine a percent of conductive material, an orientation of lines of conductive material, and a solid pattern of electrically conducting material and a mixture thereof.

10. The method of claim 9, wherein the step of identifying one or more geometric features in the circuit layer image further comprises the steps of:

grouping lines that are within a defined orientation range based at least on a prescribed reference point on the processing region;

determining an area of the lines that are within the defined orientation range for each processing region;

determining a total area of conductive material including all patterned features of each processing region;

subtracting an area of the lines from the total area of patterned conductive material of each processing region.

11. The method of claim 1, wherein the step of identifying one or more geometric features in the circuit layer image comprises the steps of:

detecting edge points corresponding to a given one of the features by performing an exclusive-OR Boolean operation of neighboring bits in the circuit layer image;

linking a connecting edge point to identify a boundary of the feature, wherein the feature comprises a line area and a solid area that are connected;

combining a consecutive edge point of equal slope into a line segment;

searching for a nearest line segment that is substantially parallel, wherein a gap between the line segments is less than a prescribed threshold, such line segments forming a segment pair;

identifying other line segments in the circuit layer image between the segment pair to form a quad segment;

combining the quad segment into said line, and collecting remaining line segments to form a boundary of the solid area corresponding to the feature.

12. The method of claim 1, wherein the step of identifying one or more geometric features in the circuit layer image comprises classifying a dominant conductive pattern in the circuit layer image.

13. The method of claim 12, wherein the step of classifying the dominant conductive pattern in the circuit layer image comprises the steps of:

classifying the circuit layer image as being of a first type when a percentage of an area of electrically conductive design features in the circuit layer image as a function of a total area of the circuit layer image is less than a first value;

classifying the circuit layer image as being of a second type when the percentage of the area of electrically conductive design features in the circuit layer image as a function of the total area of the circuit layer image is greater than a second value; and classifying the circuit layer image as being of a third type when a percentage of the area of electrically conductive design features in the circuit layer as a function of the total area of the circuit layer is features of the first and second types are identified in the circuit layer image.

14. The method of claim 13, wherein the first value is about 20 percent and the second value is about 60 percent.

15. The method of claim 1, wherein the step of generating the circuit layer image comprises generating an electronic mask output as a function of the received image of the organic substrate and converting the mask output to a format suitable for use by an image processing system.

16. The method of claim 1, wherein the at least one thermomechanical property of each of the plurality of circuit layer images comprises at least one of coefficient of thermal expansion, modulus, and Poisson's ratio.

17. An apparatus for characterizing an organic substrate including a plurality of circuit layers, the apparatus comprising:

a memory; and at least one processor coupled to the memory and operative: to receive an image of the organic substrate, the image including a geometric description of the plurality of circuit layers of the substrate; to segment the organic substrate into a plurality of processing regions based, at least in part, on geometric coordinates of circuit structures defined in the image of the substrate; to generate a circuit layer image corresponding to a selected one of the processing regions of the substrate; to identify one or more geometric features in the circuit layer image; to estimate at least one thermomechanical property of the circuit layer image as a function of the one or more identified geometric features; to repeat steps of receiving an image, generating a circuit layer image, identifying one or more geometric features, and estimating at least one thermomechanical property of the circuit layer image until all circuit layers in the substrate have been processed; and to generate a three-dimensional representation of the selected one of the processing regions of the substrate including the plurality of circuit layer images as a function of the at least one thermomechanical property of each of the plurality of circuit layer images.

18. An article of manufacture for characterizing an organic substrate including a plurality of circuit layers, the article comprising a computer readable tangible storage medium having one or more programs embodied therewith, wherein the one or more programs, when executed by a computer, perform steps of:

receiving an image of the organic substrate, the image including a geometric description of the plurality of circuit layers of the substrate;

segmenting the organic substrate into a plurality of processing regions based, at least in part, on geometric coordinates of circuit structures defined in the image of the substrate;

generating a circuit layer image corresponding to a selected one of the processing regions of the substrate;

identifying one or more geometric features in the circuit layer image;

estimating at least one thermomechanical property of the circuit layer image as a function of the one or more identified geometric features;

repeating the steps of receiving an image, generating a circuit layer image, identifying one or more geometric features in the circuit layer image, and estimating at least one thermomechanical property of the circuit layer image until all circuit layers in the substrate have been processed;

generating a three-dimensional representation of the selected one of the processing regions of the substrate including the plurality of circuit layer images as a function of the at least one thermomechanical property of each of the plurality of circuit layer images.

* * * * *